(12) United States Patent
Berkenbush et al.

(10) Patent No.: US 12,178,010 B2
(45) Date of Patent: Dec. 24, 2024

(54) ADDITIVE MANUFACTURING COMPATIBLE LIQUID-COOLED PCB CHASSIS

(71) Applicant: BAE SYSTEMS Information and Electronic Systems Integration Inc., Nashua, NH (US)

(72) Inventors: Richard E. Berkenbush, Pompton Plains, NJ (US); Robert E. Scholl, Morristown, NJ (US); Meredith T. Thanos, Morris Plains, NJ (US); Robert S. Foster, Wharton, NJ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 83 days.

(21) Appl. No.: 18/195,538

(22) Filed: May 10, 2023

(65) Prior Publication Data
US 2024/0381565 A1 Nov. 14, 2024

(51) Int. Cl.
*H05K 7/20* (2006.01)
*H05K 5/00* (2006.01)
(Continued)

(52) U.S. Cl.
CPC ....... *H05K 7/20254* (2013.01); *H05K 5/0039* (2013.01); *H05K 5/0065* (2013.01);
(Continued)

(58) Field of Classification Search
CPC .. H05K 7/20781; H05K 7/20772; H05K 7/18; H05K 7/20927; H05K 7/20809;
(Continued)

(56) References Cited

U.S. PATENT DOCUMENTS

| 6,661,657 | B1 | 12/2003 | Banton |
| 6,781,831 | B1 | 8/2004 | Banton |

(Continued)

FOREIGN PATENT DOCUMENTS

| WO | 2010138824 A2 | 12/2010 |
| WO | 2014004853 A1 | 1/2014 |

OTHER PUBLICATIONS

International Search Report, PCT/US24/27979, mailed Aug. 8, 2024, 6 pages.

*Primary Examiner* — Adam B Dravininkas
(74) *Attorney, Agent, or Firm* — Maine Cernota & Curran

(57) ABSTRACT

A liquid-cooled printed circuit board chassis, such as a Eurocard chassis, is manufactured without brazing by 3D printing a plurality of components, smoothing and completing the components by subtractive manufacture, and then aligning and assembling the final chassis, all without application of heat. Horizontal cooling channels 3D printed within the chassis components are in thermal contact with board slots, and are divided into subchannels by closely spaced internal walls that function as thermal baffles. The baffles are tilted at oblique angles to increase their cooling efficiency, and to enable AM manufacture without temporary support structures. Elastomer seals between components can connect the cooling channels to vertical connecting channels. EMI seals can be formed between the components by EMI gaskets. The components can be aligned by alignment pins, and joined together by bolts, screws, and/or adhesives. An intermediate horizontal extension can be included to accommodate shorter printed circuit boards.

20 Claims, 11 Drawing Sheets

(51) Int. Cl.
*H05K 7/18* (2006.01)
*B33Y 10/00* (2015.01)
*B33Y 40/20* (2020.01)
*B33Y 80/00* (2015.01)

(52) U.S. Cl.
CPC ............... *H05K 7/18* (2013.01); *B33Y 10/00* (2014.12); *B33Y 40/20* (2020.01); *B33Y 80/00* (2014.12)

(58) Field of Classification Search
CPC . H05K 7/20254; G06F 1/20; G06F 2200/201; H01L 23/3675; H01L 23/473
See application file for complete search history.

(56) References Cited

U.S. PATENT DOCUMENTS

| | | | |
|---|---|---|---|
| 6,879,486 B1 | 4/2005 | Banton | |
| 7,218,517 B2 | 5/2007 | Wolford | |
| 7,345,877 B2 * | 3/2008 | Asfia | F28D 15/0266 |
| | | | 361/720 |
| 7,796,384 B2 | 9/2010 | Irving | |
| 7,961,465 B2 | 6/2011 | Goldrian | |
| 8,164,906 B2 | 4/2012 | Franco | |
| 8,416,570 B2 | 4/2013 | Zeng | |
| 8,861,213 B2 | 10/2014 | Sisler | |
| 9,258,925 B2 | 2/2016 | Arvelo | |
| 9,398,682 B2 | 7/2016 | Patil | |
| 9,426,931 B2 | 8/2016 | Kaplun | |
| 10,178,800 B2 | 1/2019 | Mahalingam | |
| 10,433,465 B2 * | 10/2019 | North | H05K 7/20772 |
| 10,772,188 B1 | 9/2020 | Elsasser | |
| 11,071,221 B2 | 7/2021 | Holahan | |
| 2008/0007913 A1 * | 1/2008 | Sullivan | H05K 7/20636 |
| | | | 361/699 |
| 2008/0298014 A1 | 12/2008 | Franco | |
| 2010/0053901 A1 | 3/2010 | Irving | |
| 2013/0233523 A1 | 9/2013 | Parida | |
| 2014/0262150 A1 | 9/2014 | Icoz et al. | |
| 2015/0070848 A1 | 3/2015 | Zemke | |
| 2015/0305198 A1 * | 10/2015 | Brandt | H05K 7/20218 |
| | | | 361/699 |
| 2015/0372403 A1 | 12/2015 | Lam | |
| 2016/0029514 A1 * | 1/2016 | Alakoc | H05K 7/20254 |
| | | | 165/80.4 |
| 2017/0112018 A1 * | 4/2017 | Krivonak | H05K 7/20927 |
| 2018/0153057 A1 | 5/2018 | Chen | |
| 2019/0320556 A1 * | 10/2019 | Dariavach | H05K 7/20263 |
| 2020/0100388 A1 * | 3/2020 | Hernandez-Toledo | H05K 7/20636 |
| 2022/0256743 A1 * | 8/2022 | Pelletier | H05K 7/20254 |

* cited by examiner

ADDITIVE MANUFACTURING COMPATIBLE LIQUID-COOLED PCB CHASSIS

STATEMENT OF GOVERNMENT INTEREST

Portions of the present invention may have been made in conjunction with Government funding under contract number 19-F-2503, and there may be certain rights to the Government.

RELATED APPLICATIONS

This application is related to co-pending U.S. application Ser. No. 18/195,623, filed May 10, 2023 entitled COOLANT FLOW PARTITION FOR COOLING 3U BOARDS IN 6U CHASSIS, also by the present Applicant, which is herein incorporated by reference in its entirety for all purposes.

FIELD

The disclosure relates to chasses for mounting printed circuit boards (PCB chasses), and more particularly, to liquid-cooled PCB chasses.

BACKGROUND

For many applications it can be convenient to mount a plurality of printed circuit boards (PCBs) in a common chassis. For example, a plurality of PCBs can be slid into "slots" formed by card guides provided on the top and bottom of a chassis so that the PCBs stand on end, like books on a shelf. One or more connectors can be provided at the rear edges or "spines" of the PCBs which plug into mating connectors on a "motherboard" or "backplane" of the chassis.

One example of this approach is the "Eurocard" PCB standard and associated chasses. Eurocards are available in various heights, measured in "rack units" or "U's," where 1 U is equal to 1.75 inches (44.45 mm). Two common heights of Eurocards are 3 U (a 100 mm card in a 5.25 in (133.35 mm) sub-rack) and 6 U (a 233.35 mm card in a 10.5 in (266.70 mm) high sub-rack). As two 3 U cards are shorter than one 6 U card (by 33.35 mm), it is possible to install two 3 U cards in one slot of a 6 U sub-rack, with a mid-height structure for proper support. If electromagnetic interference shielding (EMI shielding) is required, front and rear EMI panels can be installed, with EMI gaskets included to minimize EMI leakage between the EMI panels and the chassis.

One of the advantages of assembling PCBs vertically in chasses is that it is a flexible and convenient approach for assembling an electronically dense device. This can be attractive for applications that benefit from designs that consume a minimum of space. However, the density of the electronics in such an assembly can result in the generation of excessive heat, especially if EMI panels are installed on the front and rear. This can be addressed in any of several ways. In some cases, "air cooling" is implemented, whereby a fan or similar device causes ambient or chilled air, or another gas such as nitrogen, to pass continuously between the PCBs in the chassis. While this approach can be helpful, gases generally have a low heat capacity, which limits the rate at which they can remove heat. Furthermore, this approach can be difficult or impossible to implement if the chassis is EMI shielded, because EMI shielding requires full enclosure of the environment by conductive barriers, making it difficult or impossible to provide open ports through which a cooling gas could be introduced into and exhausted from the chassis.

Instead, when removal of large amounts of heat is required, PCB chassis assemblies are sometimes cooled by a flowing liquid. According to this approach, upper and lower internal cooling channels are provided within the top and bottom of the chassis respectively through which the cooling liquid is circulated in close thermal contact with the channel guides. Metal baffles can be provided within the cooling channels to significantly increase the exchange of heat between the cooling liquid and the chassis as the liquid circulates. An interconnecting hose can be implemented to interconnect the upper and lower channels into a single cooling circulation path.

The slot guides of the chassis are machined to be highly smooth, and to make reliable and firm, high surface area contact with the upper and lower edges of the PCBs, while still enabling the PCBs to be slid into and out of the slots. Often, the PCBs will include copper backplanes and/or ground traces that are able to efficiently transfer heat from throughout the PCB to the top and bottom edges that are in contact with the chassis. In some cases, the PCBs include expandable clamps or jacks along their upper and lower edges that can be deployed to ensure optimal thermal contact with the channel guides.

Liquid-cooled PCB chasses can be very efficient in removing heat from densely packed electronics. They are usually constructed through multiple applications of brazing, such as dip brazing or vacuum brazing. The brazing process helps to ensure that the chassis is structurally robust, even when exposed to strong vibrations. Also, brazing helps to ensure that EMI is not able to leak past joints formed between components of the assembled chassis. However, liquid cooled chasses can be highly expensive and time consuming to fabricate, in part because brazing can require fabrication by specialized brazing facilities that exercise independent control over the process, including the number of sections to be fabricated and joined together, thereby introducing significant complexity and cost. Typically, baffles are implemented in the cooling channels by brazing individual thin panels within open channels, and then brazing covers over the open channels to form the enclosed channels. Furthermore, vacuum brazing generally requires that the baffle be implemented as "fins" that are perpendicular to the flow direction of the cooling channel, which minimizes the contact surface area between the fins and the cooling liquid.

Using this brazing approach, a chassis can be constructed in segments. For example, the top, bottom, and sides can be separately brazed together and machined to close tolerances, after which the entire assembly is carefully aligned and brazed into a single unit. Great care must be exercised to ensure that the heat of the brazing process does not warp the chassis or otherwise degrade its tolerances.

Design of a new liquid-cooled PCB chassis can be prohibitively time consuming and expensive. Eight to twelve months can be required before the first article of a new production is received. When developing a new, complex PCB chassis system, for example a beta-test system, the excessive time and expense required to manufacture each prototype can be intolerable.

What is needed, therefore, is a method of rapidly and cost effectively manufacturing a liquid-cooled PCB chassis, and a PCB chassis design that is compatible therewith.

SUMMARY

The present disclosure is a method of rapidly and cost effectively manufacturing a liquid-cooled PCB chassis, and a PCB chassis design that is compatible therewith. The disclosed method enables fabrication of a robust, vibration resistant chassis with fewer production steps, and without any requirement for brazing, thereby avoiding the distortion and warping concerns that arise from brazing, and reducing costs and the time required to produce a first article of manufacture.

Instead of relying on brazing, the disclosed method includes producing a plurality of complex chassis components by additive manufacture (AM), including components that comprise internal cooling-liquid channels with baffles, thereby reducing the number of manufacturing steps that are required. Interconnections between the cooling channels are provided by connecting channels that are also formed within the chassis components by additive manufacture, thereby providing a more compact and reliable design as compared to conventional, brazed designs that use hoses to interconnect the cooling channels. After 3D printing and post-AM machining, alignment pins are used to position the components, which are then fastened together without application of heat by using a plurality of bolts or screws that provide robust, vibration-resistant joining. In embodiments, EMI gaskets are installed between the components to prevent EMI leakage.

Additive manufacture (AM) of metal structures, also sometimes referred to as 3D "printing" of metal structures, is a rapidly growing approach, both for prototyping of new metal structures and for manufacture of structures that are complex, produced in small quantities, and/or otherwise benefit from additive manufacture. For example, additive manufacture can sometimes readily produce complex, nested structures in a single printing step that would be difficult or impossible to manufacture using conventional methods, or at least would require multiple steps of manufacture and assembly. Common approaches to AM of metals include "Direct Metal Laser Sintering" (DMLS) and other "powder bed" additive manufacturing, whereby a metal powder is continuously distributed onto an object of manufacture and "fused" into place where needed by focused electron or laser beams. Another approach is direct energy deposition, whereby molten metal is deposited directly onto a structure through a heated nozzle, which can be made of titanium or cobalt chrome. Any of these approaches can be combined with Hot Isostatic Pressing (HIP), which involves the simultaneous application of high temperature and pressure to the AM manufactured item for a specified amount of time in order to improve its densification and other mechanical properties.

It will be noted that the terms "additive manufacture" and "AM" are used herein to refer specifically and exclusively to 3D printing methods that are applicable to metals, and that the definitions of "additive manufacture" and "AM", as the terms are used herein, do not extend to other methods of manufacture in which elements are combined or "added" to each other, such as welding, brazing, soldering, gluing, riveting, bolting, etc. "Subtractive" methods of manufacture, as used herein, refers to methods that remove material from a workpiece, such as cutting, drilling, milling, and polishing. A distinction is sometimes made herein between methods of joining elements that require application of heat, such as welding, brazing, and soldering, and methods that do not require application of heat, such as threaded attachment by screws or bolts, and attachment by adhesives.

While AM can be ideal for rapid manufacture and prototyping, and can produce complex structures in a single-step process, additive manufacture may also subject to several fundamental limitations. In particular, additive manufacture may result in a structure with rough surfaces, according to the layer "resolution" of the printing process.

Also, additive manufacture is fundamentally a "vertical" manufacturing process. Typically, without additional support, a structure cannot deviate from vertical by more than 45 degrees as it is being formed by AM. Otherwise, additional temporary "support" structure is required, for example when printing a horizontal "overhang," horizontal hole, or other horizontal or near-horizontal structure. Once the printing process is completed, the additional support structure must be removed as a post-printing step. Accordingly, support structure can only be employed in areas where subsequent access will be available to remove the support material.

AM manufacture also becomes more expensive, and ultimately impractical, as the size of the manufactured item is increased. Often, the size of the printing "bed" is the primary limitation, with the maximum printing height being greater than the maximum width and depth.

Due to these limitations, it is generally difficult to produce a liquid-cooled PCB chassis in a single step by additive manufacture. In particular, the AM process might result in slot guides with rough side surfaces, which could not be machined if the chassis were produced as a single part, and would greatly diminish the thermal contact between the chassis and the PCBs, rendering the cooling much less efficient. Furthermore, printing the entire chassis in a single step would require use of an expensive AM device having a large "footprint." In addition, if a "powder bed" AM method such as DMLS is used, it could be difficult to remove the excess metal powder if the PCB chassis is "printed" in a single step. Furthermore, if HIP is applied, any remaining powder may be sintered to the structure, and may restrict or block the flow of liquids through the cooling channels.

Instead, according to the present disclosure, a PCB chassis is produced by using AM to create a plurality of chassis components, which can then be separately machined to provide smooth and precisely dimensioned slot guides. The chassis components further include holes provided for alignment pins and attachment screws, so that the chassis components can be readily assembled in precise alignment after machining to provide the complete chassis. In embodiments, O-ring grooves or similar provisions are included to enable liquid-tight sealing between the cooling fluid channels of the chassis components. And in some embodiments, grooves or similar provisions are also included for EMI gaskets, which can be installed during assembly to prevent EMI leakage between the chassis components.

According to the present disclosure, baffles within the cooling channels are configured such that during the AM process they do not deviate from the vertical by more than 45 degrees. In embodiments, at least one of the cooling "channels" comprises a manifold at one end that distributes the cooling liquid among a plurality of separate, narrow channels that flow in parallel with each other, with the "baffles" forming the dividing walls between the narrow channels. A second manifold collects and recombines the separate streams of cooling liquid as they emerge from the narrow channels.

A first general aspect of the present disclosure is a liquid cooled chassis suitable for supporting and cooling a plurality of printed circuit boards. The chassis includes a plurality of metal chassis components including opposing, spaced apart, substantially horizontally parallel first and second chassis components, each of the first and second chassis components comprising a plurality of equally spaced, inwardly extending slot guides defining slots therebetween, at least some of the slots of the first chassis component being substantially vertically aligned with corresponding slots of the second chassis component, and being spaced apart therefrom so as to support vertical printed circuit boards inserted therebetween, while placing the slot guides that bound the slots into thermal communication with the inserted printed circuit boards.

The chassis further includes first and second cooling channels formed respectively within the first and second chassis components in thermal communication with the slot guides, the cooling channels being configured to permit a cooling liquid to flow horizontally therethrough, and thereby to extract heat from the printed circuit boards, each of the cooling channels being bridged by a plurality of closely spaced planar baffles extending parallel to a flow direction of the cooling channels and dividing each of the cooling channels into a plurality of parallel sub-channels, the planar baffles being integral and monolithic with the first and second chassis components, and being inclined from horizontal at an angle of between 20 degrees and 45 degrees, a spacing between the baffles being less than a width of the baffles.

And the chassis further includes vertical third and fourth chassis components included in the plurality of chassis components, the third and fourth chassis component being configured for attachment without application of heat to the horizontal first and second chassis components, and a connecting channel formed in the third chassis component, the connecting channel being configured to convey the cooling liquid from the cooling channel of the first chassis component to the cooling channel of the second chassis component, the third chassis component being configured to form liquid-tight connections between the connecting channel and the first and second cooling channels when the third chassis component is attached to the first and second chassis components.

In embodiments, the sub-channels in each of the first and second chassis components are joined together at opposing ends thereof by manifolds that distribute the cooling liquid from a single inlet among the sub-channels at an inlet end of the cooling channel, and combine the cooling liquid from the sub-channels into a single outlet at an outlet end of the cooling channel.

In any of the above embodiments, the liquid-tight connections between the connecting channels and the first and second cooling channels can be formed by elastomeric gaskets located in gasket grooves formed in at least some of the chassis components.

In any of the above embodiments, the chassis components can be further configured to form electromotive interference (EMI) seals between the first and second chassis components and the third and fourth chassis components when the chassis component are assembled together. In some of these embodiments, the EMI seals are formed by EMI gaskets located in EMI grooves provided in at least some of the chassis components.

In any of the above embodiments, attachment together of the chassis components can include mutual attachment by screws or bolts.

In any of the above embodiments, attachment together of the chassis components can include mutual attachment by an adhesive.

In any of the above embodiments, the chassis components can be aligned with each other when assembled together by alignment pins inserted into alignment holes provided in the chassis components.

In any of the above embodiments, the third chassis component can further include a horizontal extension that extends horizontally between some of the slots of the first and second chassis components, the horizontal extension comprising both upward and downward extending channel guides separated by extension grooves formed therebetween, each of said extension grooves being aligned with a corresponding groove in either the first or the second chassis component. Some of these embodiments further include a third cooling channel formed within the horizontal extension and in fluid communication with the connecting channel of the third chassis component.

In any of the above embodiments, the chassis can be configured to accept, support, and cool printed circuit boards that meet the Eurocard PCB standard.

In any of the above embodiments, the chassis components can be built using additive manufacturing and subsequent subtractive manufacturing.

A second general aspect of the present disclosure is a method of manufacturing the chassis of the first general disclosure. The method includes constructing the first, second, and third chassis components, including the cooling and connecting channels and the baffles within the cooling channels, by additive manufacture, the baffles being formed without inclusion of temporary supporting structure, manufacturing the fourth chassis component by additive manufacture or by subtractive manufacture, applying subtractive manufacture to the chassis components, the subtractive manufacture comprising smoothing mutual contact surfaces of the chassis components by subtractive manufacture, and smoothing side surfaces of the slot guides and adjusting spacings therebetween by subtractive manufacturing, aligning the chassis components with each other, and joining together the chassis components without application thereto of heat.

In embodiments, the subtractive manufacture further comprises forming gasket grooves in at least some of the chassis components, and wherein joining together the chassis components includes inserting elastomeric gaskets into the gasket grooves and compressing the elastomeric gaskets between the chassis components.

In any of the above embodiments, the subtractive manufacture can further include forming EMI grooves in at least some of the chassis components, and joining together the chassis components can include inserting EMI gaskets into the EMI grooves and compressing the EMI gaskets between the chassis components.

In any of the above embodiments, the subtractive manufacture can further include forming alignment holes in the chassis components, and joining together the chassis components can include aligning the alignment holes and inserting alignment pins therein.

In any of the above embodiments, joining together the chassis components can include threaded attachment, wherein screws or bolts are inserted through holes provided in the chassis components during either the additive manufacture or the subtractive manufacture, and the screws or bolts can be threaded into nuts, or into threaded holes provided in the chassis components by subtractive manufacture.

In any of the above embodiments, the additive manufacture of the third chassis component can further include forming a horizontal extension that extends substantially horizontally between some of the slots of the first and second chassis components, the horizontal extension comprising both upward and downward extending channel guides separated by extension grooves formed therebetween, each of said extension grooves being aligned with a corresponding groove in either the first or the second chassis component. In some of these embodiments, the additive manufacture further includes forming a third cooling channel within the horizontal extension and in fluid communication with the connecting channel of the third chassis component.

And in any of the above embodiments, the chassis can be configured to accept, support, and cool printed circuit boards that meet the Eurocard PCB standard.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The present disclosure is a method of rapidly and cost effectively manufacturing a liquid-cooled PCB chassis, and a PCB chassis design that is compatible therewith. The disclosed method enables fabrication of a robust, vibration resistant chassis with fewer production steps, and without any requirement for brazing, thereby avoiding the distortion and warping concerns that arise from brazing, and reducing costs and the time required to produce a first article of manufacture.

Figure 1:
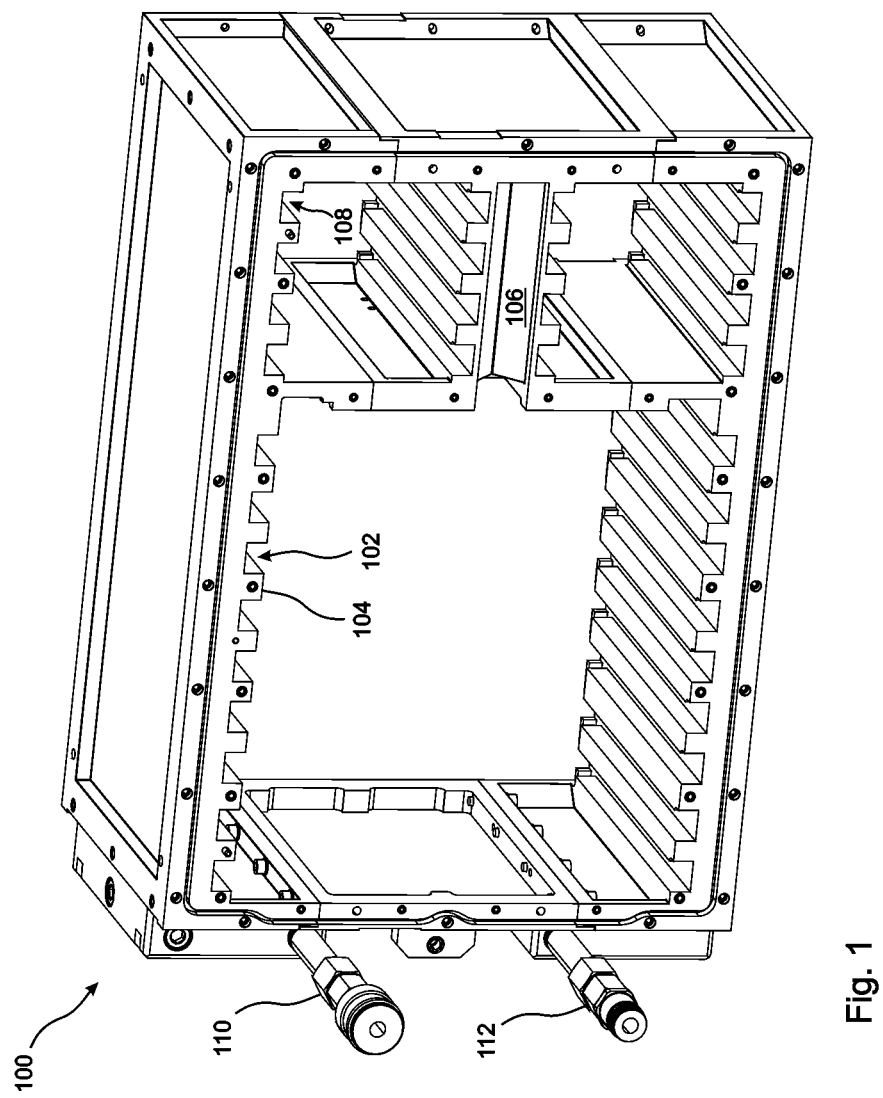
FIG. 1 is a perspective view drawn to scale of a liquid-cooled printed circuit board chassis in an exemplary embodiment of the present disclosure.
Figure 2:
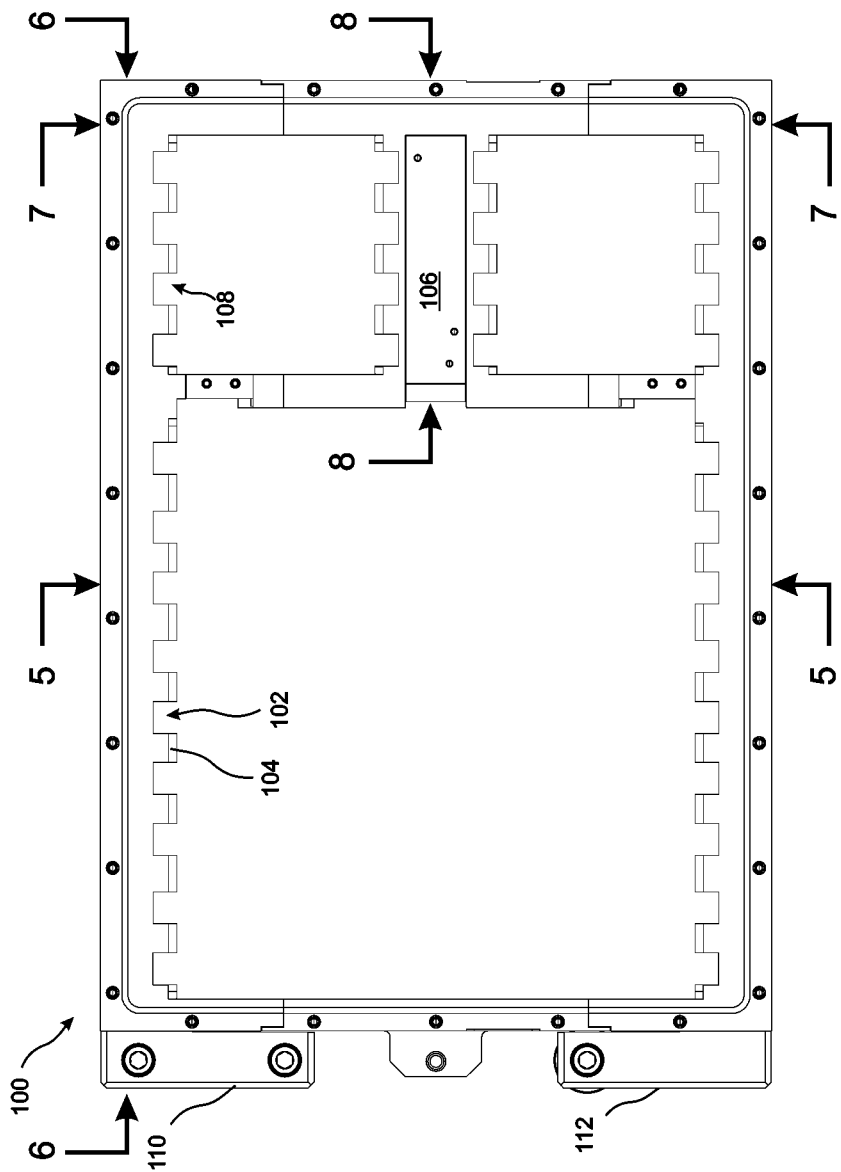
FIG. 2 is a side view drawn to scale of the embodiment of FIG. 1.

An exemplary embodiment of the present disclosure is illustrated in the perspective view of FIG. 1 and the side view of FIG. 2. In the illustrated embodiment, a chassis is provided within which nine 6 U printed circuit boards (PCBs, not shown) can be mounted by sliding them into 6 U "slots" 102 formed by card guides 104 provided on the top and bottom of the chassis 100 so that the PCB boards stand on end, like books on a shelf. The illustrated embodiment includes a mid-height structure 106 that divides a right portion of the chassis 100 into eight 3 U slots 108. Cooling channels and interconnecting channels, discussed in more detail below, are included in the chassis 100 through which a cooling liquid such as PAO (polyalphaolefin) can be circulated.

Figure 3:
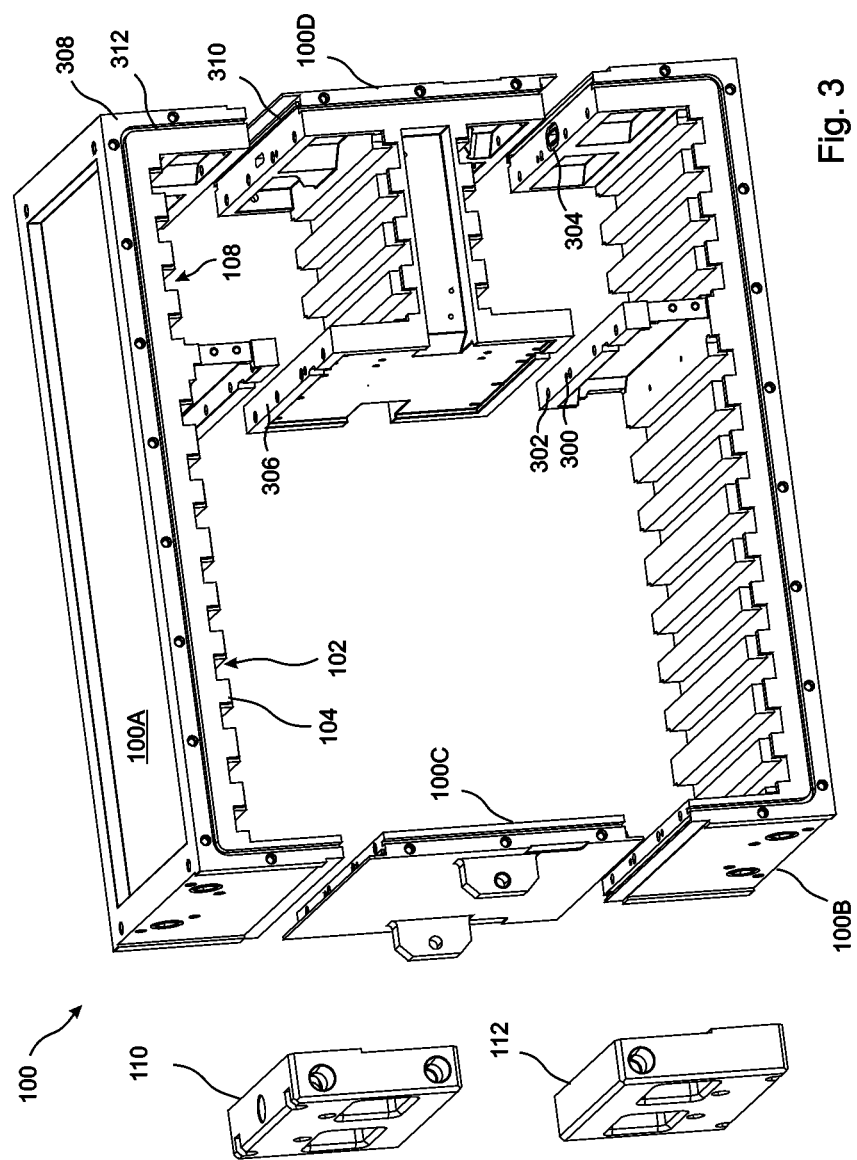
FIG. 3 is an exploded perspective view drawn to scale of the embodiment of FIG. 1.
Figure 4:
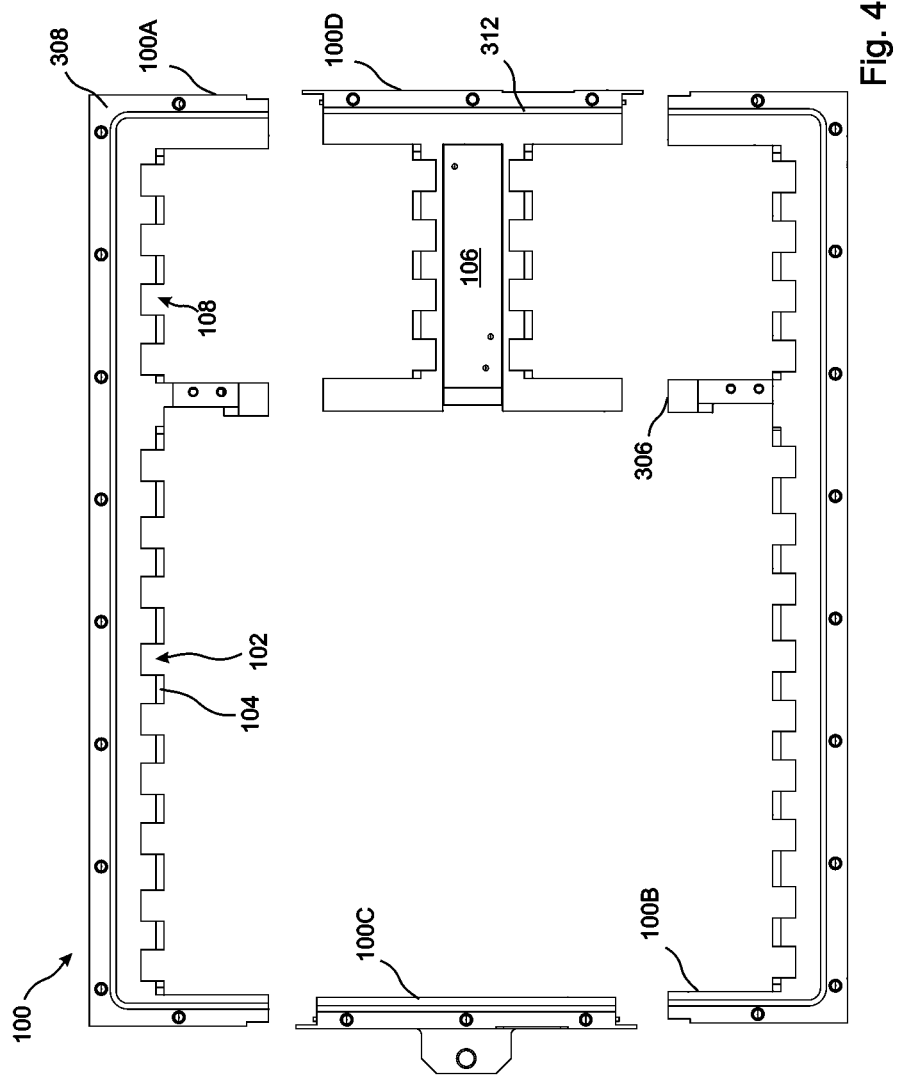
FIG. 4 is a side exploded view drawn to scale of the embodiment of FIG. 1.

With reference to the exploded perspective and side views of FIGS. 3 and 4 respectively, the PCB chassis 100 is produced by using additive manufacture to create the chassis components 100A, 100B, 100D that include cooling channels, which are then separately machined to provide highly smooth slot guides 104, end faces 306, and side faces 308, as well as precisely dimensioned slots 102, 108. Chassis components 100C that do not include cooling channels can be produced by additive manufacture or by conventional machining. The chassis components 100A-D further include alignment pin holes 300 and attachment screw holes 302, so that the chassis components 100A-D can be readily assembled in precise alignment after machining to provide the complete chassis 100. In embodiments, O-ring grooves 304 or similar provisions are included to enable liquid-tight sealing between the cooling fluid channels of the chassis components. The illustrated embodiment further includes EMI gasket grooves 310, 312 in which EMI gaskets can be installed to prevent EMI leakage between the assembled components 100A, 100B, 100C, 100D.

Figure 5:
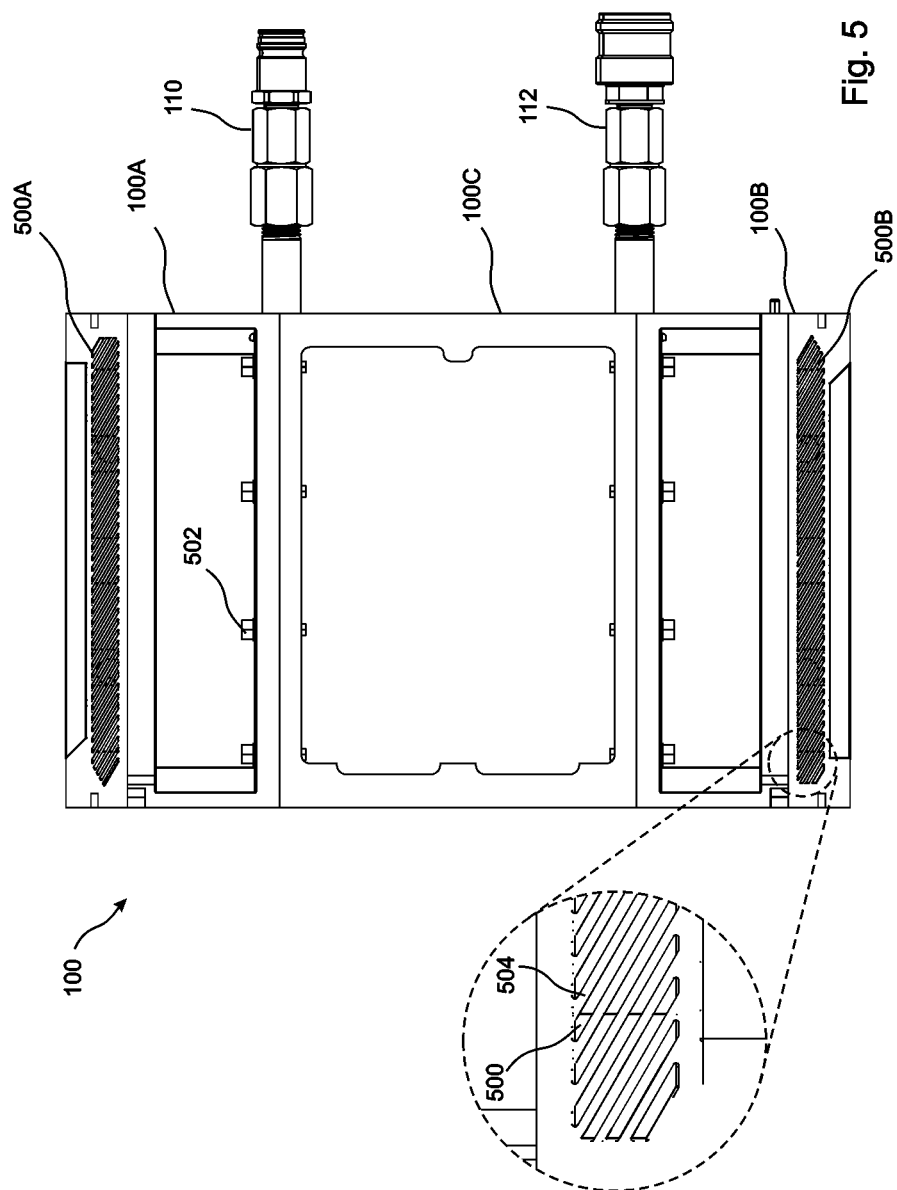
FIG. 5 is a central vertical sectional view drawn to scale of the embodiment of FIG. 2.

With reference to FIG. 5, cooling channels 500A, 500B, are formed within the upper 100A and lower 100D chassis components of the chassis 100 during the additive manufacture process. FIG. 5 is a vertical sectional view taken along the plane indicated in FIG. 2. It can be seen in the drawing that the cooling channels 500A, 500B in the illustrated embodiment divided into long, slanted, rectangular sub-channels 500 that are separated by slanted planar walls which function as planar baffles 504 that exchange heat with the cooling liquid. Attachment screws 502 are also visible in the drawing. In the illustrated embodiment four attachment screws are implemented along each of the inter-component joints to ensure robust vibration resistance and full engagement of the cooling liquid gaskets 304 and the EMI gaskets 310.

Figure 6:
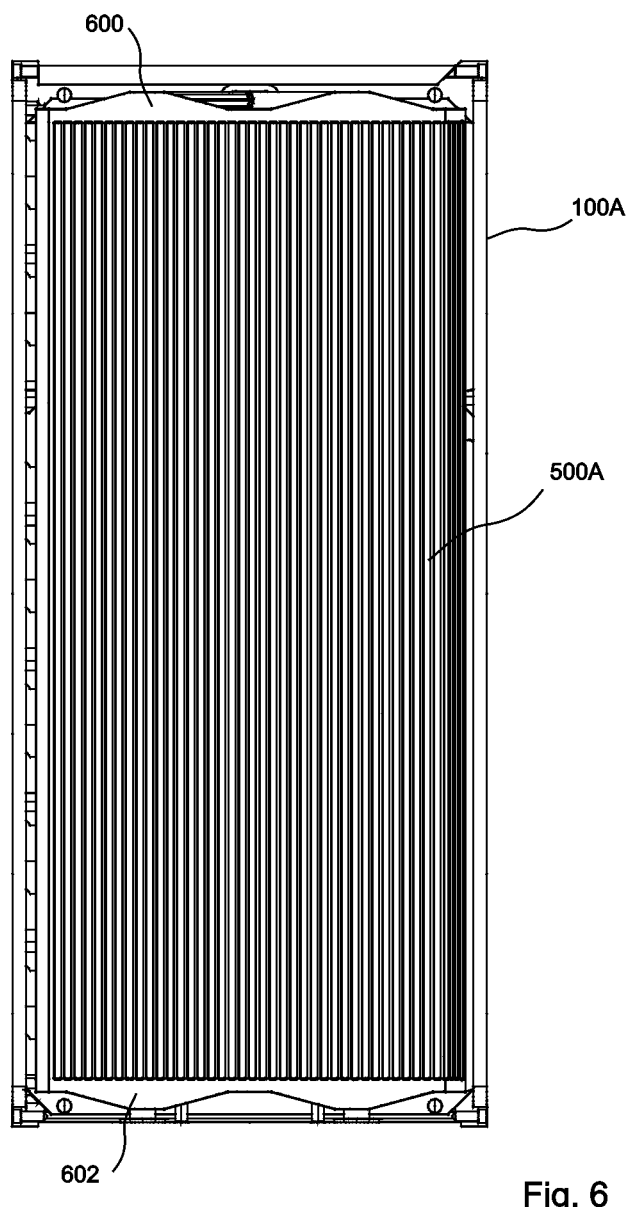
FIG. 6 is a horizontal upper sectional view drawn to scale of the embodiment of FIG. 2.

FIG. 6 is a horizontal, sectional view, taken along the plane indicated in FIG. 2, of the cooling channels 500A in the upper chassis component 100A of the chassis 100. It can be seen that the cooling channels 500A extend in thermal contact with the slot guides 104 along most of the length of the chassis component 100A, and terminate at each end in a manifold 600, 602. The cooling liquid enters from the chassis inlet 110 into the first manifold 600, which distributes the cooling liquid among the separate, narrow cooling sub-channels 500 that flow in parallel with each other. A second manifold 602 collects and recombines the separate streams of cooling liquid as they emerge from the narrow sub-channels 500 and through the chassis outlet 112.

Figure 7:
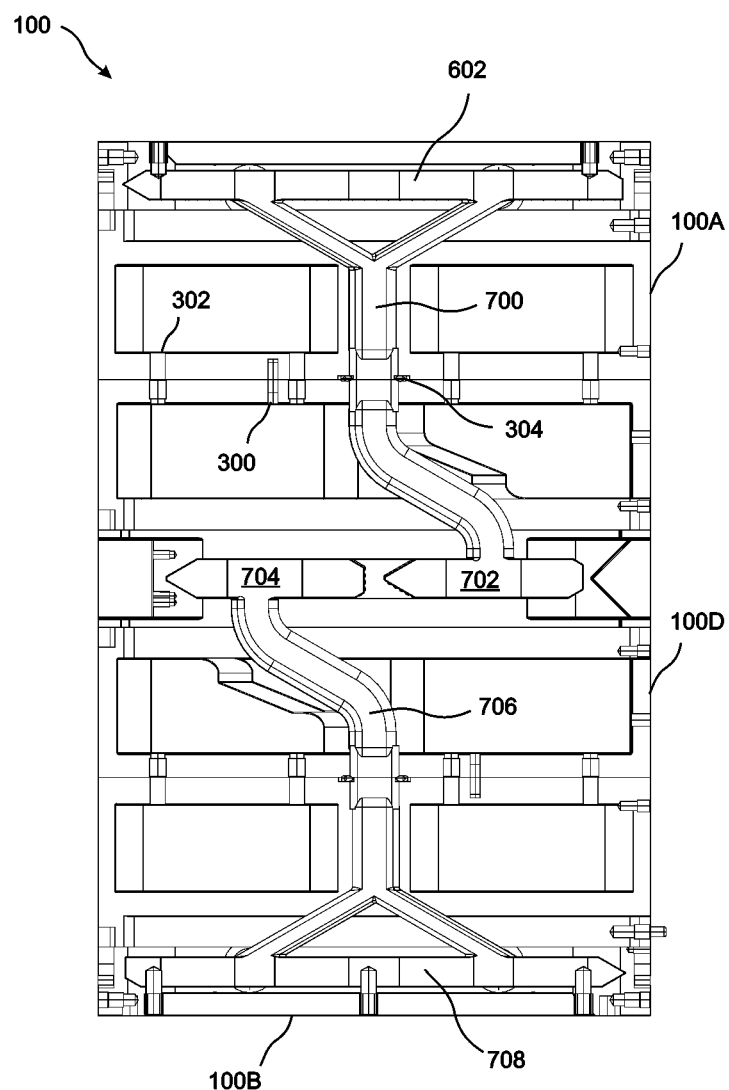
FIG. 7 is a right-side vertical sectional view drawn to scale of the embodiment of FIG. 2.

FIG. 7 is a vertical sectional view, taken along the plane indicated in FIG. 2 at the right side of the chassis 100, passing through chassis component 100D. It can be seen in the drawing that the cooling liquid that is collected in manifold 602 flows through a first connecting channel 700 through a liquid-tight interconnection 304 to an inlet manifold 702 provided in the right-side chassis component 100D. After flowing through the right-side chassis component 100D, the cooling liquid emerges from an outlet manifold 704 and enters a second connecting channel 706, which directs the cooling liquid through another liquid-tight connection to an inlet manifold of the lower chassis component 100B. Instead of interconnecting the cooling channels with hoses, the AM manufacturing of the disclosed method enables the relatively complex connecting channels 700, 706 to be easily incorporated into the side walls of the chassis components 100A, 100D, 100B, thereby providing a more compact and reliable design as compared to conventional, brazed designs that use hoses to interconnect cooling channels.

Figure 8:
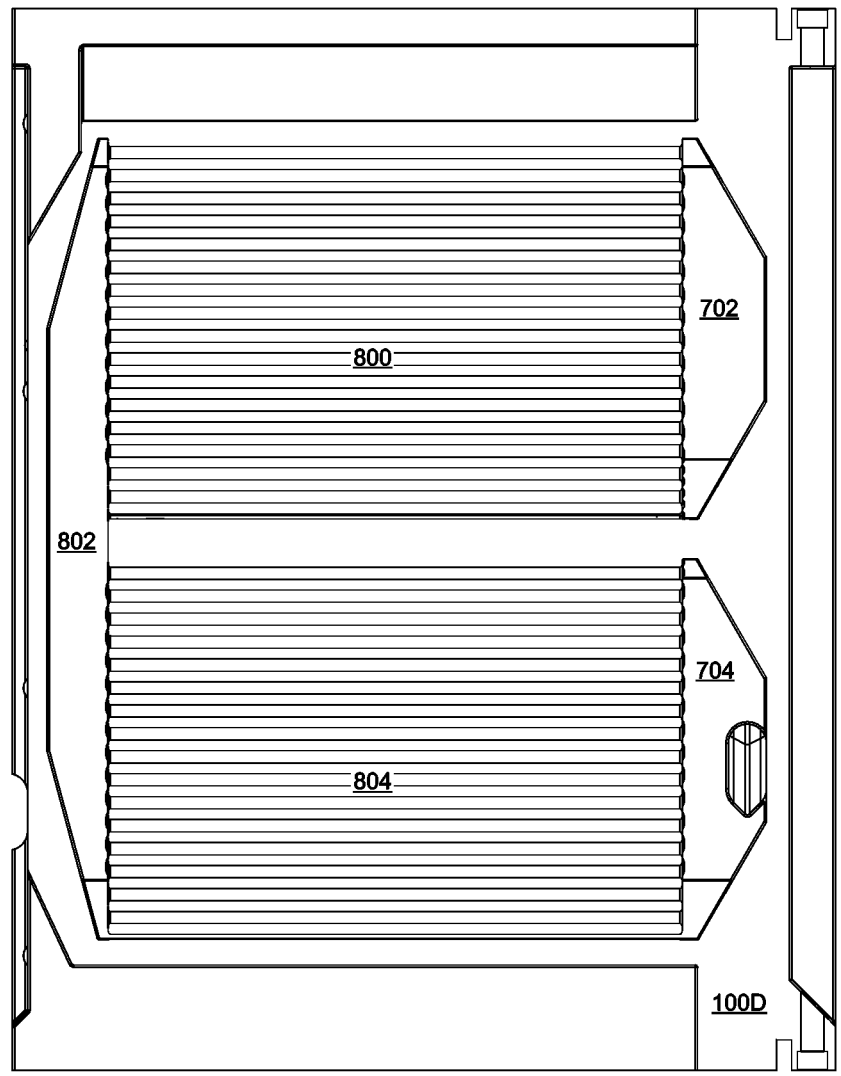
FIG. 8 is a right-side central horizontal sectional view drawn to scale of the embodiment of FIG. 2.

FIG. 8 is a horizontal sectional view taken along the plane indicated in FIG. 2 which illustrates the horizontal cooling channels 800, 804 and manifolds 702, 802, 704 of the right-side chassis component 100D of the chassis 100. In particular, the inlet manifold 702 distributes the cooling liquid among a first plurality of cooling channels 800. The cooling liquid is then consolidated by an intermediate manifold 802, and distributed among a second plurality of cooling channels 804. Finally, the cooling liquid is consolidated by the outlet manifold 704 and directed into the second connecting channel 706. The configurations of the cooling channels 600, 604 in the right side chassis component 100D are similar in configuration to the cooling channels 500A, 500B in the upper 100A and lower 100B chassis components of the chassis 100.

Figure 9:
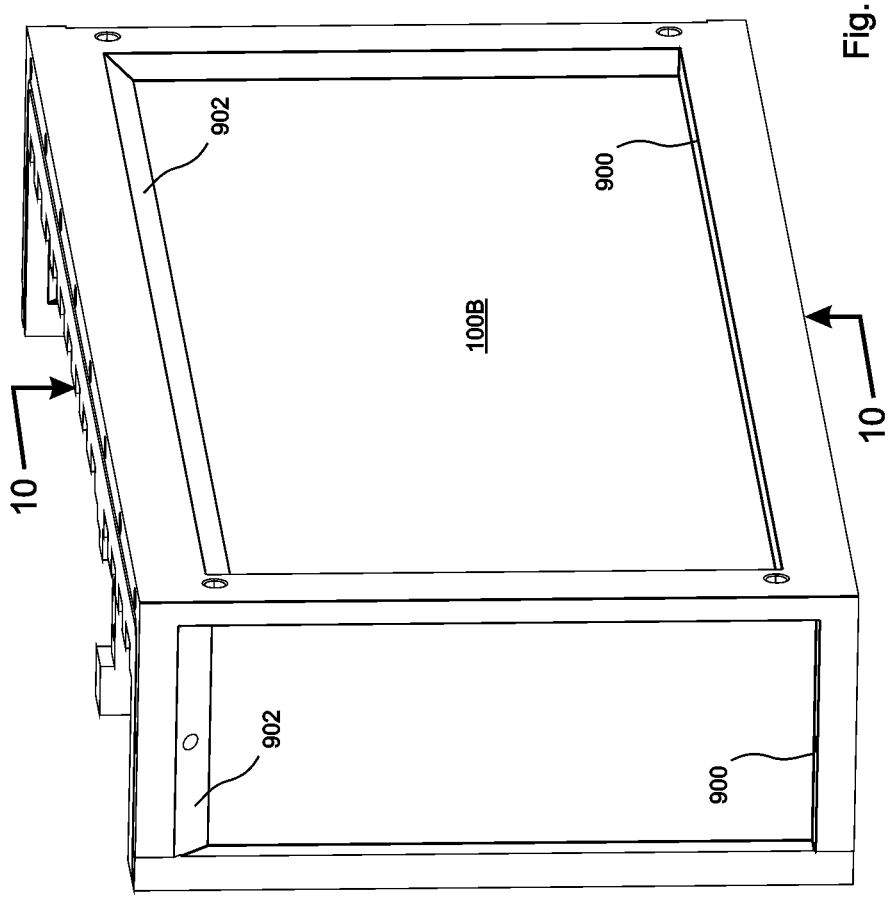
FIG. 9 is a perspective view drawn to scale of the bottom chassis component of the embodiment of FIG. 3.

As discussed above, additive manufacturing (AM) is generally not able to create severe overhangs. In general, without added support, structures generally cannot "grow" during AM at an angle that is more than 45 degrees away from vertical. FIG. 9 is a perspective view of the bottom chassis component 100B of the exemplary embodiment, oriented as it would be during additive manufacture. It can be seen that the "shelves" 900 near the base of the chassis component 100B are horizontal. However, "shelves" 902 that are higher up are slanted at an angle of about 45 degrees from vertical. This approach avoids the need to include support structure which would require removal after the AM was complete. Growing the component 100B in this orientation also allows it to be positioned diagonally on the printer bed, thereby reducing the size of the bed that is required.

Figure 10:
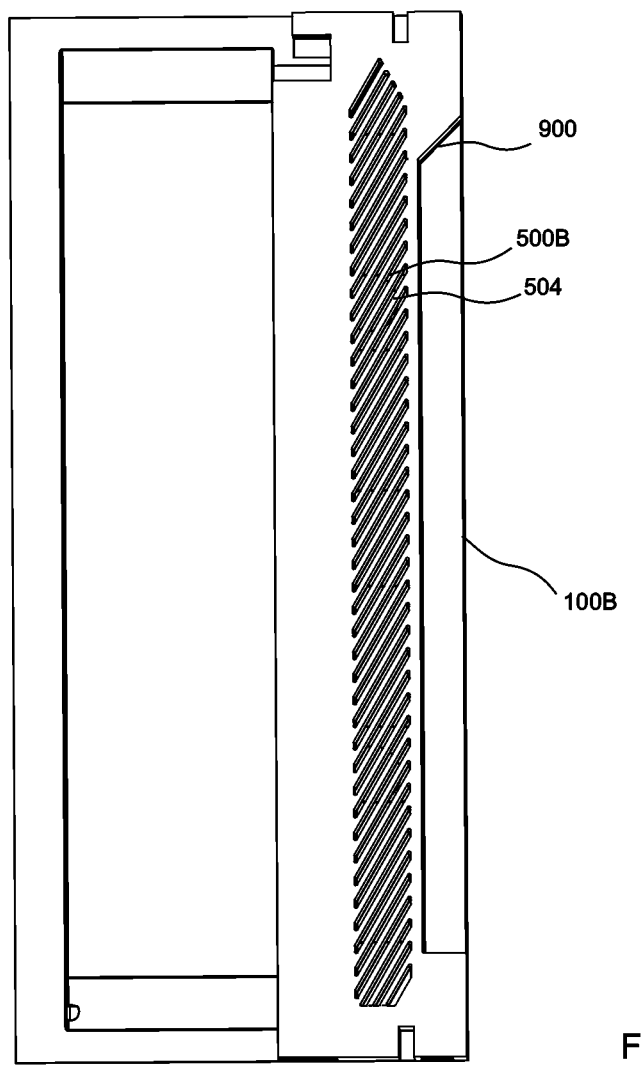
FIG. 10 is a central vertical sectional view drawn to scale of the chassis component of FIG. 9.

FIG. 10 is a sectional view taken in the plane indicated in FIG. 9, also oriented as it would be during manufacture. It can clearly be seen that the "walls" between the cooling sub-channels 500, which function as the "baffles 504" of the cooling sub-channels 500, are inclined at an angle of much less than 45 degrees from vertical, the spacing between the baffles 504 being less than the width of the baffles 504. In embodiments, the baffles 504 are inclined at an angle of between 20 degrees and 45 degrees. By slanting these baffle walls, their contact surface area with the cooling liquid is significantly increased, thereby increasing the cooling efficiency of the channels. This slanting of the baffles 504 would be difficult to achieve by vacuum brazing. Furthermore, inclining the baffle walls at this angle eliminates any need for temporary support structure when forming the baffles 504 by AM. Because the cooling channels 500A, 500B, 700, 704 are fully enclosed, it would not be possible to remove support structure if any were needed. Furthermore, the rough texture that naturally results on the baffle surfaces from the AM process serves to increase the baffle surface area, and to generate turbulence within the cooling channels 500A, 500B, 700, 704, thereby further improving the cooling efficiency. This cooling channel and baffle configuration, which is readily produced by additive manufacture, would be difficult to produce by conventional means.

In summary, instead of relying on brazing, the disclosed method includes using additive manufacture to produce a plurality of complex chassis components 100A, 100B, 100D that comprise internal cooling-liquid channels 500A, 500B, 802, 804 with baffles 504, thereby reducing the number of manufacturing steps that are required. Interconnections between the cooling channels 500A, 500B, 802, 804 are provided by connecting channels 700, 706, that are also formed within the chassis components 100A, 100D, 100B by additive manufacture, thereby providing a more compact and reliable design as compared to conventional, brazed designs that use hoses to interconnect the cooling channels. After 3D printing and post-AM machining, alignment pins are used to position the components 100A, 100B, 100C, 100D, which are then fastened together using a plurality of bolts or screws 502 that provide robust, vibration-resistant joining. In embodiments, EMI gaskets are installed in grooves 310 formed in end faces 306 of the components 100A, 100B, 100D to prevent EMI leakage.

Figure 11:
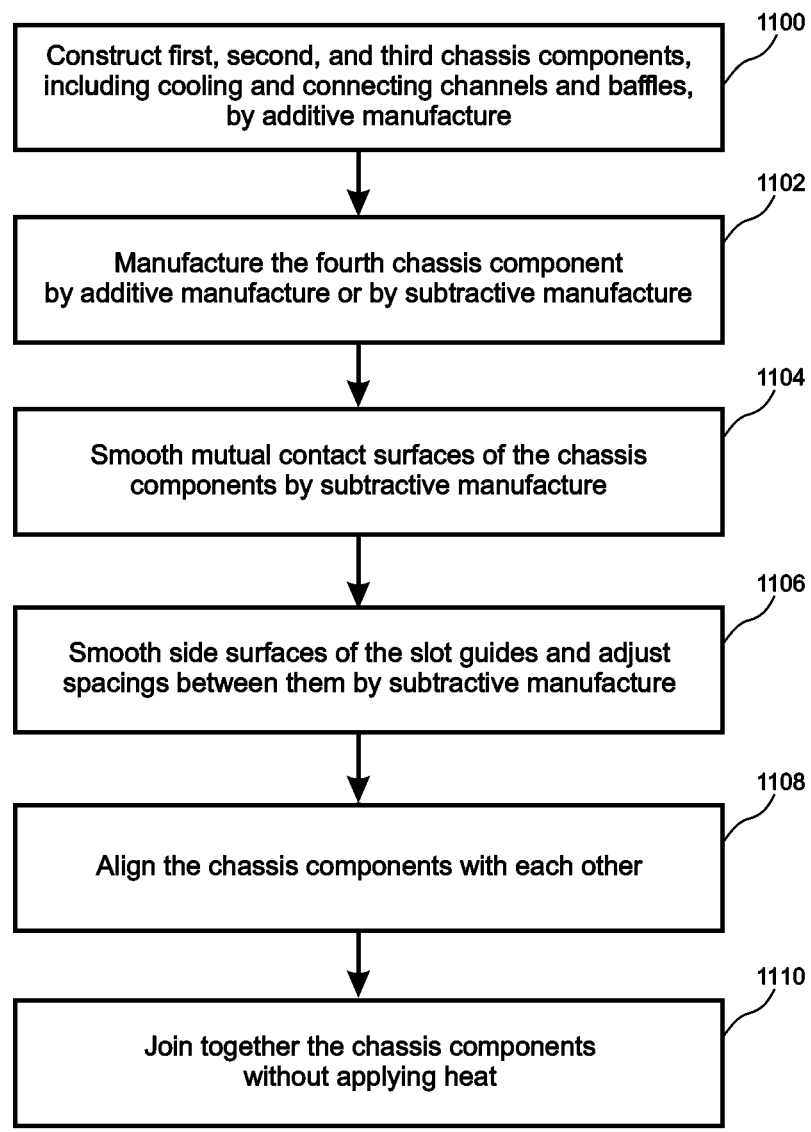
FIG. 11 is a flow diagram that illustrates a method embodiment of the present disclosure.

With reference to FIG. 11, a method embodiment of the present disclosure includes constructing the first, second, and third chassis components, including the cooling and connecting channels and baffles, by additive manufacture 1100, and manufacturing the fourth chassis component by additive manufacture or by subtractive manufacture 1102. The mutual contact surfaces of the chassis components are then smoothed by subtractive manufacture 1104, and the side surfaces of the slot guides are smoothed and the spacings between them are adjusted by subtractive manufacture 1106. Finally, the chassis components are aligned with each other 1108 and then joined together without applying heat 1110, for example using alignment pins and screws.

The foregoing description of the embodiments of the disclosure has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the disclosure to the precise form disclosed. Many modifications and variations are possible in light of this disclosure.

Although the present application is shown in a limited number of forms, the scope of the disclosure is not limited to just these forms, but is amenable to various changes and modifications. The disclosure presented herein does not explicitly disclose all possible combinations of features that fall within the scope of the disclosure. The features disclosed herein for the various embodiments can generally be interchanged and combined into any combinations that are not self-contradictory without departing from the scope of the disclosure. In particular, the limitations presented in dependent claims below can be combined with their corresponding independent claims in any number and in any order without departing from the scope of this disclosure, unless the dependent claims are logically incompatible with each other.

What is claimed is:

1. A liquid cooled chassis suitable for supporting and cooling a plurality of printed circuit boards, the chassis comprising:

a plurality of metal chassis components including opposing, spaced apart, substantially horizontally parallel first and second chassis components, each of the first and second chassis components comprising a plurality of equally spaced, inwardly extending slot guides defining slots therebetween, at least some of the slots of the first chassis component being substantially vertically aligned with corresponding slots of the second chassis component, and being spaced apart therefrom so as to support vertical printed circuit boards inserted therebetween, while placing the slot guides that bound the slots into thermal communication with the inserted printed circuit boards;

first and second cooling channels formed respectively within the first and second chassis components in thermal communication with the slot guides, the cooling channels being configured to permit a cooling liquid to flow horizontally therethrough, and thereby to extract heat from the printed circuit boards, each of the cooling channels being bridged by a plurality of closely spaced planar baffles extending parallel to a flow direction of the cooling channels and dividing each of the cooling channels into a plurality of parallel sub-channels, the planar baffles being integral and monolithic with the first and second chassis components, and being inclined from horizontal at an angle of between 20 degrees and 45 degrees, a spacing between the baffles being less than a width of the baffles;

vertical third and fourth chassis components included in the plurality of chassis components, the third and fourth chassis component being configured for attachment without application of heat to the horizontal first and second chassis components; and a connecting channel formed in the third chassis component, the connecting channel being configured to convey the cooling liquid from the cooling channel of the first chassis component to the cooling channel of the second chassis component, the third chassis component being configured to form liquid-tight connections between the connecting channel and the first and second cooling channels when the third chassis component is attached to the first and second chassis components.

2. The chassis of claim 1, wherein the sub-channels in each of the first and second chassis components are joined together at opposing ends thereof by manifolds that distribute the cooling liquid from a single inlet among the sub-channels at an inlet end of the cooling channel, and combine the cooling liquid from the sub-channels into a single outlet at an outlet end of the cooling channel.

3. The chassis of claim 1, wherein the liquid-tight connections between the connecting channels and the first and second cooling channels are formed by elastomeric gaskets located in gasket grooves formed in at least some of the chassis components.

4. The chassis of claim 1, wherein the chassis components are further configured to form electromotive interference (EMI) seals between the first and second chassis components and the third and fourth chassis components when the chassis component are assembled together.

5. The chassis of claim 4, wherein the EMI seals are formed by EMI gaskets located in EMI grooves provided in at least some of the chassis components.

6. The chassis of claim 1, wherein attachment together of the chassis components comprises mutual attachment by screws or bolts.

7. The chassis of claim 1, wherein attachment together of the chassis components comprises mutual attachment by an adhesive.

8. The chassis of claim 1, wherein the chassis components are aligned with each other when assembled together by alignment pins inserted into alignment holes provided in the chassis components.

9. The chassis of claim 1, wherein the third chassis component further comprises a horizontal extension that extends horizontally between some of the slots of the first and second chassis components, the horizontal extension comprising both upward and downward extending channel guides separated by extension grooves formed therebetween, each of said extension grooves being aligned with a corresponding groove in either the first or the second chassis component.

10. The chassis of claim 9, further comprising a third cooling channel formed within the horizontal extension and in fluid communication with the connecting channel of the third chassis component.

11. The chassis of claim 1, wherein the chassis is configured to accept, support, and cool printed circuit boards that meet the Eurocard PCB standard.

12. The chassis of claim 1, wherein the chassis components are built using additive manufacturing and subsequent subtractive manufacturing.

13. A method of manufacturing the chassis of claim 1, the method comprising:

constructing the first, second, and third chassis components, including the cooling and connecting channels and the baffles within the cooling channels, by additive manufacture, the baffles being formed without inclusion of temporary supporting structure;

manufacturing the fourth chassis component by additive manufacture or by subtractive manufacture;

applying subtractive manufacture to the chassis components, the subtractive manufacture comprising smoothing mutual contact surfaces of the chassis components by subtractive manufacture, and smoothing side surfaces of the slot guides and adjusting spacings therebetween by subtractive manufacturing;

aligning the chassis components with each other; and joining together the chassis components without application thereto of heat.

14. The method of claim 13, wherein the subtractive manufacture further comprises forming gasket grooves in at least some of the chassis components, and wherein joining together the chassis components includes inserting elastomeric gaskets into the gasket grooves and compressing the elastomeric gaskets between the chassis components.

15. The method of claim 13, wherein the subtractive manufacture further comprises forming EMI grooves in at least some of the chassis components, and wherein joining together the chassis components includes inserting EMI gaskets into the EMI grooves and compressing the EMI gaskets between the chassis components.

16. The method of claim 13, wherein the subtractive manufacture further comprises forming alignment holes in the chassis components, and wherein joining together the chassis components includes aligning the alignment holes and inserting alignment pins therein.

17. The method of claim 13, wherein joining together the chassis components comprises threaded attachment, wherein screws or bolts are inserted through holes provided in the chassis components during either the additive manufacture or the subtractive manufacture, and wherein the screws or bolts are threaded into nuts, or into threaded holes provided in the chassis components by subtractive manufacture.

18. The method of claim 13, wherein the additive manufacture of the third chassis component further comprises forming a horizontal extension that extends substantially horizontally between some of the slots of the first and second chassis components, the horizontal extension comprising both upward and downward extending channel guides separated by extension grooves formed therebetween, each of said extension grooves being aligned with a corresponding groove in either the first or the second chassis component.

19. The method of claim 18, wherein the additive manufacture further comprises forming a third cooling channel within the horizontal extension and in fluid communication with the connecting channel of the third chassis component.

20. The method of claim 13, wherein the chassis is configured to accept, support, and cool printed circuit boards that meet the Eurocard PCB standard.

* * * * *